(12) United States Patent
Forstner et al.

(10) Patent No.: US 7,482,972 B2
(45) Date of Patent: Jan. 27, 2009

(54) INTEGRATED MULTI-MIXER CIRCUIT

(75) Inventors: Johann Peter Forstner, Steinhöring (DE); Bernhard Dehlink, Unterhaching (DE)

(73) Assignee: Infineon Technologies AG, Munich (DE)

( * ) Notice: Subject to any disclaimer, the term of this patent is extended or adjusted under 35 U.S.C. 154(b) by 216 days.

(21) Appl. No.: 11/427,858

(22) Filed: Jun. 30, 2006

(65) Prior Publication Data

US 2008/0001810 A1    Jan. 3, 2008

(30) Foreign Application Priority Data

May 24, 2006    (DE) .................. 10 2006 024 458

(51) Int. Cl.
*G01S 13/00*    (2006.01)
(52) U.S. Cl. .................................. 342/175
(58) Field of Classification Search .......... 342/175, 342/195, 194, 189, 70, 71, 72; 375/244–252, 375/258; 455/130, 132, 189.1, 209, 269, 455/272, 280, 319, 330, 334, 338
See application file for complete search history.

(56) References Cited

U.S. PATENT DOCUMENTS

| | | | | |
|---|---|---|---|---|
| 3,577,146 A | * | 5/1971 | Freier et al. | 342/458 |
| 5,376,902 A | | 12/1994 | Bockelman et al. | 333/5 |
| 5,886,591 A | * | 3/1999 | Jean et al. | 333/118 |
| 6,054,948 A | * | 4/2000 | Dean | 342/372 |
| 7,031,689 B2 | * | 4/2006 | Frank | 455/333 |
| 2005/0212090 A1 | | 9/2005 | Friedrich et al. | 257/620 |
| 2006/0049979 A1 | | 3/2006 | Miosga et al. | 342/175 |
| 2006/0119530 A1 | | 6/2006 | Kronberger | 343/803 |

FOREIGN PATENT DOCUMENTS

| | | |
|---|---|---|
| DE | 69423684 T2 | 11/2000 |
| DE | 10026227 A1 | 12/2001 |
| DE | 102004014644 A1 | 10/2005 |
| DE | 102004027839 A1 | 1/2006 |
| EP | 1024590 A1 | 8/2000 |
| EP | 1231825 A1 | 8/2002 |
| WO | 98/16848 A1 | 4/1998 |
| WO | 03/100456 A1 | 12/2003 |

OTHER PUBLICATIONS

Okazaki et al. (Wide-band SSB subharmonically pumped mixer MMIC, Okazaki, H.; Yamaguchi, Y.; Microwave Theory and Techniques, IEEE Transactions on vol. 45, Issue 12, Part 2, Dec. 1997 pp. 2375-2379.*

(Continued)

*Primary Examiner*—Thomas H Tarcza
*Assistant Examiner*—Peter M Bythrow
(74) *Attorney, Agent, or Firm*—Eschweiler & Associates, LLC (57) ABSTRACT

An integrated circuit has an input terminal, a first circuit portion having a first coupler coupled to the input terminal and a first mixer coupled to the first coupler. A first antenna terminal is coupled to the first coupler. A second circuit portion has a second coupler coupled to the input terminal and a second mixer coupled to the second coupler, and a second antenna terminal is coupled to the second coupler.

41 Claims, 3 Drawing Sheets

OTHER PUBLICATIONS

Dearn "An RFOW Testable DRO for use within a Complete MMIC Low Noise Downconverter" (4 pages).
Haydl et al. "Single-Chip Coplanar 94-GHz FMCW Radar Sensors" IEEE Microwave and Guided Wave Letters, vol. 9, No. 2 (pp. 73-75), Feb. 1999.
U.S. Appl. No. 11/427,847, filed Jun. 30, 2006 entitled "Apparatus and Methods for Performing a Test".
U.S. Appl. No. 11/427,852, filed Jun. 30, 2006 entitled "Integrated Circuit for Transmitting and/or Receiving Signals".

* cited by examiner

INTEGRATED MULTI-MIXER CIRCUIT

PRIORITY

This application claims priority from German Patent Application No. 10 2006 024 458.3, which was filed on May 24, 2006, and is incorporated herein by reference in its entirety.

TECHNICAL FIELD

The present invention relates to an integrated circuit with a multi-mixer architecture, such as it is used in vehicle radar devices.

BACKGROUND

For applications in the vehicle radar field, there is a continuous increase in integration. Particularly by the use of Si/SiGe technologies (silicon/silicon-germanium), a significantly higher degree of integration may be achieved as compared to GaAs (gallium-arsenide). The reproducibility of passive distributing networks is also considerably higher on-chip, i.e. integrated on the chip, than on radio frequency circuit board material, such as Rogers 3003™. This, in turn, may require ways to be able to manage this high integration in highest frequency ranges. For example, the on-chip isolation between different circuit components is very problematic at these high frequencies.

Currently, what is used for realizing vehicle radar circuits in so-called MMICs (monolithic microwave integrated circuits) are integrated single mixers fed on the local oscillator side and on the antenna side correspondingly by distributing networks implemented on the radio frequency circuit board material. Reproducibility is limited due to manufacturing tolerances on the substrate, and space requirements may be relatively high. In addition, unbalanced and/or unsymmetrical or "single-ended" RF transitions in the form of, for example, bond interfaces are used. Due to these unbalanced transitions where the compensation current flows to the signal current in the on-chip reference plane, an RF signal is mapped on the on-chip reference plane that may disturb the circuits and may thus limit the isolation of adjacent blocks on the chip.

SUMMARY

According to an embodiment, an integrated circuits comprises an input terminal, a first circuit portion comprising a first coupler coupled to the input terminal and a first mixer coupled to the first coupler, a first antenna terminal coupled to the first coupler, a second circuit portion comprising a second coupler coupled to the input terminal and a second mixer coupled to the second coupler, and a second antenna terminal coupled to the second coupler.

BRIEF DESCRIPTION OF THE DRAWINGS

Embodiments of the present invention are explained in more detail in the following with respect to the accompanying drawings, in which.

DETAILED DESCRIPTION

According to a further embodiment, a method for transmitting and receiving radio frequency signals has the steps of receiving a differential radio frequency input signal, dividing the differential input signal into a first part and a second part, coupling a part of the first part of the differential input signal to a first antenna terminal, and mixing another part of the first part of the differential input signal with a first reception signal, and coupling a part of the second part of the differential input signal to a second antenna terminal and mixing another part of the second part of the differential input signal with a second reception signal.

Thus, embodiments may have the advantage that, by an integration of several couplers and mixers on a chip, originally unbalanced transitions in the transmitting branch may become balanced, i.e. differential, transitions. In that way, transition losses of signals of an RF circuit board onto the chip may be reduced, and the influence of spurious signals on the on-chip reference plane can be reduced due to the fact that a compensation current does no longer flow in a reference plane as in the case of the single-ended transition.

Further embodiments may have the advantage that a completely differential architecture is used on the chip and thus balance converters and/or so-called baluns (BALanced/UNbalanced), i.e. converters between a balanced and an unbalanced signal routing or vice versa, on the chip may be omitted. The omission of baluns may also result in a reduced mixer noise factor. Furthermore, no signal is mapped on the on-chip reference plane due to the consistently differential signal routing, and the isolation between the individual mixers may be increased.

Before embodiments will be explained in more detail in the following with reference to FIGS. 2-4, first an implementation with individual mixer chips is described based on FIG. 1.

Figure 1:
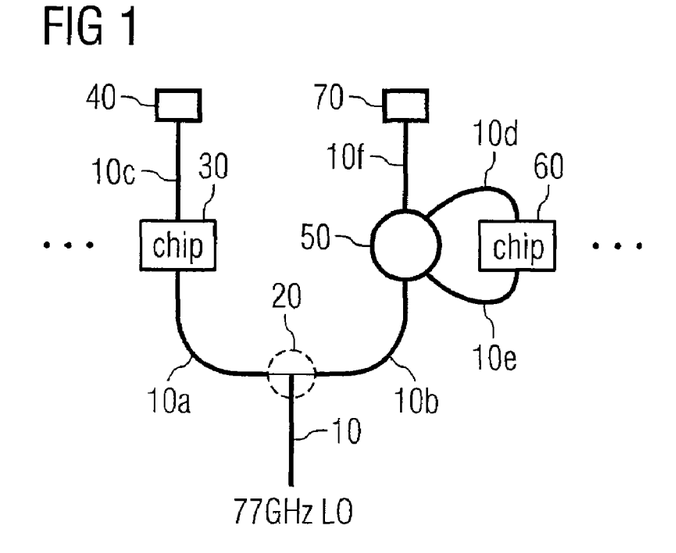
FIG. 1 is a schematic representation of an interconnection of individual mixer chips on an RF substrate.

FIG. 1 shows a basic representation of an interconnection of individual discrete mixer MMICs on an RF circuit board.

FIG. 1 shows a feed line 10 divided into a line 10a and a line 10b by a power divider 20. A first mixer chip 30 is coupled, on the one hand, to the power divider 20 via line 10a, and on the other hand to a first antenna element 40 via a further line 10c. Furthermore, FIG. 1 shows a directional coupler 50. A first terminal of the directional coupler 50 is connected to the power divider 20 via the line 10b. A further mixer chip 60 is connected to second and third terminals of the directional coupler 50 via lines 10d and 10e. A fourth terminal of the directional coupler 50 is connected to a second antenna element 70 via a line 10f.

In FIG. 1, the branch connected to the antenna element 40 acts as pure reception branch, whereas the branch connected to the antenna element 70 may act both as transmission and as reception branch. The power supplied to the circuit via the line 10 is equally divided to the two circuit branches via the power divider 20. The coupler 50 additionally causes an additional coupler loss in the transmission branch, before a transmission signal may be emitted via the antenna element 70.

According to FIG. 1, unbalanced signal routing is used. However, balanced and/or differential transitions behave in a much more good-natured way with respect to manufacturing tolerances and losses. A differential signal is understood to be a signal composed of two signals routed via two lines which are opposite in phase to each other with respect to a reference potential.

Figure 2:
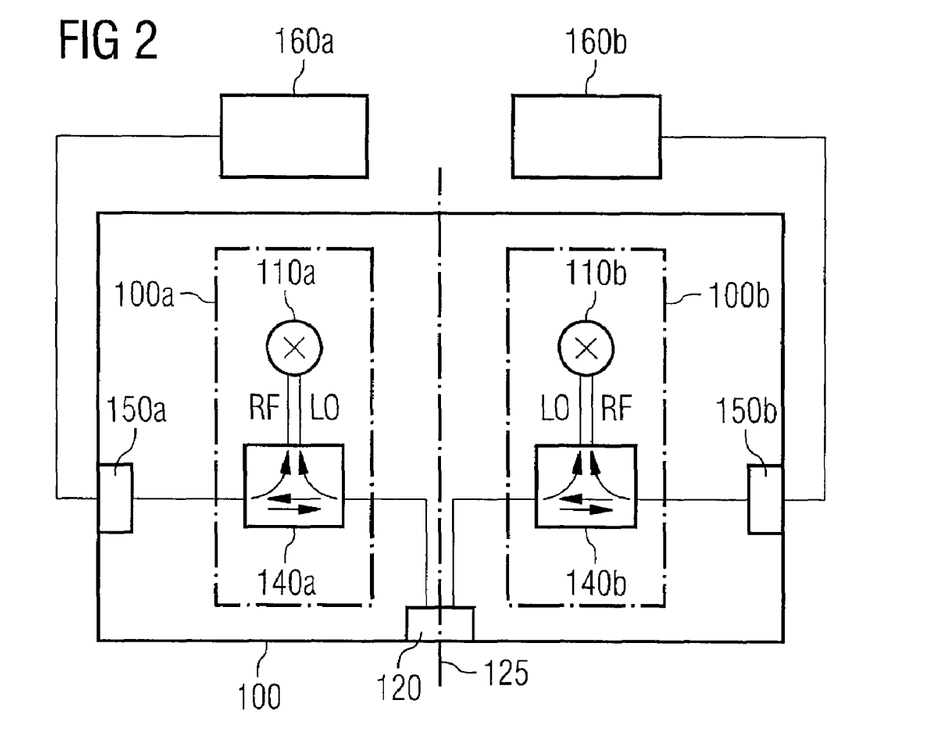
FIG. 2 is a block circuit diagram for illustrating an integration of two mixers on a chip.

An embodiment is shown in FIG. 2. FIG. 2 shows a block circuit diagram for illustrating an integration of two mixers on a semiconductor chip 100.

The integrated circuit 100 includes a first circuit portion 100a and a second circuit portion 100b. The integrated circuit 100 further comprises an input 120 for receiving an input signal. The first circuit portion 100a comprises a first directional coupler 140a and a first mixer 110a. The second circuit portion 100b comprises a second directional coupler 140b and a second mixer 110b. Furthermore, a first antenna terminal 150a and a second antenna terminal 150b are provided on the integrated circuit 100. The first antenna terminal 150a is further coupled to a first reception antenna 160a, and the second antenna terminal 150b is coupled to a second reception antenna 160b. The first coupler 140a is coupled to the input terminal 120, the first antenna terminal 150a and/or the first reception antenna 160a and the mixer 110a. The second coupler 140b is coupled to the input terminal 120, the second antenna terminal 150b and/or the second reception antenna 160b and the mixer 110b. The first coupler 140a thus allows to couple an RF signal received at the input terminal 120 to the first antenna terminal 150a and/or the first reception antenna 160a and the first mixer 110a and/or to couple an RF signal received at the first antenna terminal 150a to the first mixer 110a. Accordingly, the second coupler 140b allows to couple an RF signal received at the input terminal 120 to the second antenna terminal 150b and/or the second reception antenna 160b and the second mixer 110b and/or to couple an RF signal received at the second antenna terminal 150b to the second mixer 110b. In this way, the first and second circuit portions 100a, 100b may respectively receive reception signals via the first and second reception antennas 160a, 160b and mix them with the RF signal parts incoming at the input terminal 120. This circuit may thus be used for a radar circuit in which RF signals emitted via the first and second antennas 150a, 150b are compared to RF signals received from a reflective object by the reception antennas 160a, 160b. The comparison of the two RF signals may be used for the determination of the distance and shape of the reflective object.

For example, the emitting RF signal in one embodiment has a frequency linearly increasing in time that is periodically reset to an initial frequency value in a saw tooth-like manner after a predetermined time (chirp signal). Due to the path length travelled by the emitted RF signals from the first and second antennas to the reflective object and back to the reception antenna, the output RF signal and the received RF signal have a different frequency, wherein the frequency difference is a measure for the distance between the reflective object and the reception antennas. The first and second mixers 110a and 110b are capable of determining the frequency difference and outputting a corresponding signal to an evaluation circuit (not shown).

The above described radar system is based on the linear frequency modulated continuous wave (LFMCW) radar concept, in which a distance and speed determination of a targeted object is permitted by the determination of the frequency shift due to the linear frequency increase of the emitted RF signal. However, it should be clear for someone skilled in the art that the integrated circuits described in this application are not limited to an LFMCW radar measurement, but are also suitable for other radar measurements, such as the Doppler radar.

By the integration of the two individual mixers 110a and 110b on a chip, the reproducibility may be improved due to the manufacturing tolerances on the substrate and the space requirements may be reduced in the embodiment illustrated in FIG. 2. Particularly, the integration of the two circuit units 100a and 100b on a chip allows to achieve that the first circuit unit 100a is arranged highly mirror-symmetrically to the second circuit unit 100b. The mirror-symmetric arrangement of the two circuit units with respect to the axis 125 and the differential input 120 common to the two circuit units are responsible for the fact that, on the common reference plane ("ground"), the compensation currents of the first circuit unit 100a, which may be required for a signal transmission, compensate the compensation currents of the second circuit unit. In this way, the voltage fluctuations generated by compensation currents compensate each other on the reference plane, significantly reducing the susceptibility to interference of the circuit.

In a further embodiment, the input terminal is a differential input terminal, wherein the signal routing to the first coupler and to the second coupler is designed differentially, at least in part. Particularly, the first coupler is coupled to a first terminal pole of the differential input terminal via a first line, and the second coupler is coupled to a second terminal pole of the differential input terminal via a second line. By means of the differential input terminal, transition losses may be reduced with this embodiment, and due to the fact that the compensation current does no longer flow in the on-chip reference plane, as in a single-ended transition, less spurious signals can form on the on-chip reference plane.

In a further embodiment, the first coupler and the second coupler are coupled to the differential input terminal via differential lines and a differential power divider, as will be described below with respect to FIG. 4. This allows to generally omit baluns on the chip for completely differential signal routing. Therefore, the mixers may have a further reduced noise factor. In addition, no signal may be mapped on the on-chip reference plane due to the consistently differential signal routing, and the isolation between the individual mixers may be increased.

In a next embodiment, the second circuit portion is arranged in a mirror-symmetric way to the first circuit portion. In this way, mutual electromagnetic spurious influences of the two circuit portions may be reduced.

In embodiments, the integrated circuit comprises radio frequency suitable components produced by special manufacturing processes, particularly an Si/SiGe process or an indium phosphide process. In the Si/SiGe manufacturing process known to those skilled in the art, the base of the bipolar transistors is, for example, doped with germanium. In this way, the circuit may be used in radio frequency ranges, particularly at frequencies higher than 10 GHz.

Preferably, embodiments of a circuit are used as radar circuit in which an input signal has a frequency of more than 1 GHz, preferably more than 20 GHz and more preferably more than 70 GHz.

Figure 3:
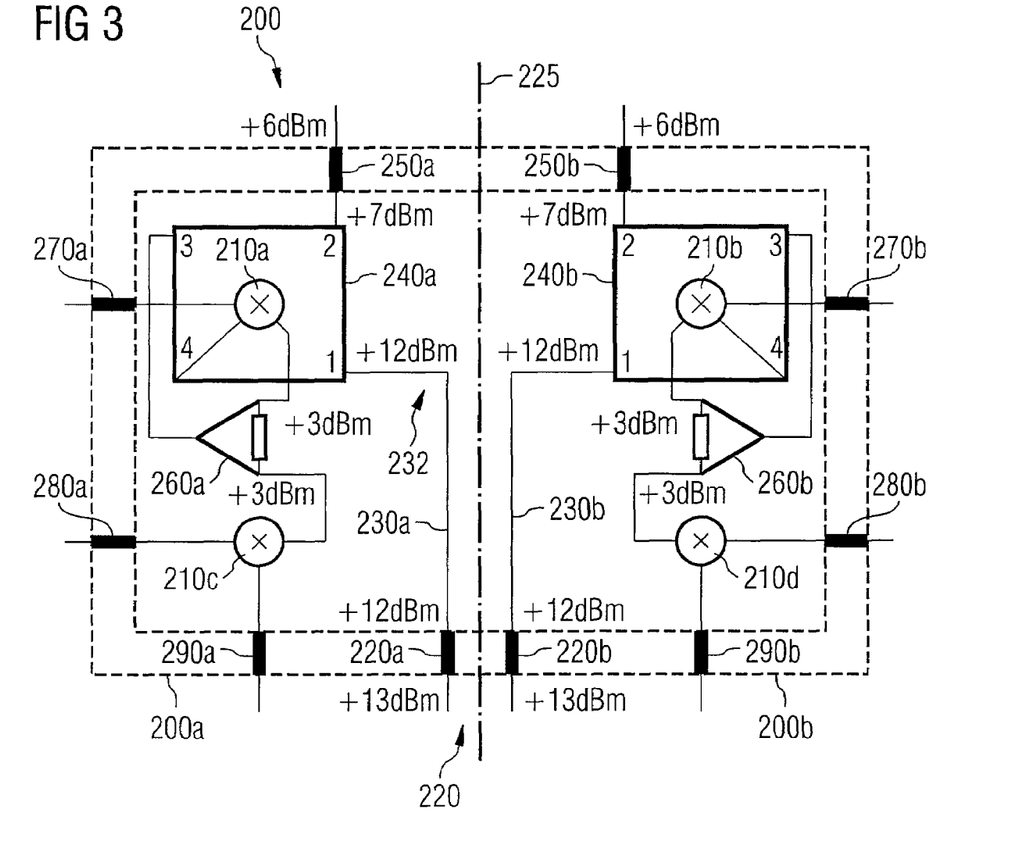
FIG. 3 is a block circuit diagram for illustrating an integration of four individual mixers on a chip.

FIG. 3 shows a block circuit diagram for illustrating an integration of several individual unbalanced mixers on a semiconductor chip 200. In the present embodiment, the semiconductor chip 200 comprises four mixers 210a-d arranged symmetrically. Furthermore, the integrated circuit 200 comprises a first circuit portion 200a (left) and a second circuit portion 200b (right) of the integrated circuit. The two circuit portions 200a, b are arranged mirror-symmetrically to an axis 225 extending through the integrated circuit 200 illustrated in FIG. 3 in the center from top to bottom. Due to the symmetry and the resulting analogy of the circuit portions 200a, b and due to the common differential input 220, the compensation currents of the first circuit portion 200a compensate the compensation currents of the second circuit portion 200b. This is based on the fact that, due to the differential input 220, the signal of the one terminal pole 220a is phase shifted by 180 degrees with respect to the signal of the second terminal pole 220b.

Due to the mirror symmetry of the first and second circuit portions 200a, 200b with respect to each other, circuit descriptions will be limited to only the circuit portion 200a in the following.

The integrated circuit 200 comprises a differential input 220 for receiving a differential RF input signal, wherein the differential input comprises a pair of terminal poles 220a and 220b. A first terminal pole 220a of the differential input is connected to a first unbalanced terminal of a first directional coupler 240a via a first line 230a. Furthermore, a first unbalanced antenna terminal 250a is connected to a second unbalanced terminal of the first directional coupler 240a. Via a third unbalanced terminal of the first directional coupler 240a, the same is coupled to a first power divider 260a. Furthermore, a first output of the power divider 260a is connected to a first input of a first unbalanced mixer 210a whose second input is connected to the first unbalanced antenna terminal 250a via the directional coupler 240a. An unbalanced output 270a of the integrated circuit 200 constitutes an output of the first unbalanced mixer 210a. The unbalanced output 270a conventionally transmits the low frequency signal generated by the first mixer 210a, which contains the distance or speed information of a targeted object, to the outside, where it is evaluated by an evaluating circuit (not shown), depending on the application.

Furthermore, a second unbalanced output of the power divider 260a is connected to a first unbalanced input of a third mixer 210c of the integrated circuit 200. A further unbalanced antenna terminal 280a of the integrated circuit 200 is connected to a second unbalanced input of the third mixer 210c. A third unbalanced terminal of the mixer 210c constitutes an output of the mixer 210c and is connected to a further unbalanced terminal 290a of the integrated circuit 200.

The structure of the first circuit portion 200a of the integrated circuit just described correspondingly applies to the second circuit portion 200b arranged mirror-symmetrically to the first circuit portion 200b, the second circuit portion comprising a second directional coupler 240b coupled to the terminal pole 220b of the input terminal 220, and a second mixer 210b coupled to the second directional coupler 240b. Furthermore, the second circuit portion 200b includes a second antenna terminal 250b coupled to the second coupler 240b. Due to the mirror symmetry to the first circuit portion 200a, the description of the structure of the second circuit portion 200b of the integrated circuit 200 will be committed at this point for reasons of clarity.

Via the terminal poles 220a, b of the differential input 220 of the integrated circuit 200, an RF signal of a local oscillator (LO) not illustrated is, for example, fed in, wherein a distance between the first terminal pole 220a and the second terminal pole 220b of the differential input terminal 220 is preferably smaller than 1000 μm, preferably smaller than 100 μm and more preferably smaller than 50 μm. The differential lines of the line pair 230a, b have a distance of preferably less than 1000 μm, preferably less than 100 μm and more preferably of less than 10 μm with respect to each other and are arranged with respect to each other so that they have a predetermined wave impedance of, for example, 50 ohm. For vehicle radar applications, the frequency of the input signal may, for example, be at 77 GHz. Now a first part of the differential radio frequency input signal is routed onto the first directional coupler 240a via the terminal pole 220a. It couples 50% of the power of the RF signal fed in via the line 230a onto the antenna terminal 250a. At this antenna terminal, there may be connected, for example, a patch antenna acting both as transmission and as reception antenna of the vehicle radar system. The second 50% of the power of the first part of the fed in RF input signal are coupled onto the input of the power divider 260a via a third terminal of the directional coupler 240a. As a result, 25% of the first part of the RF input signal fed in at the input 220a are applied to the two outputs of the power divider 260a, respectively, which are supplied to the two unbalanced mixers 210a and 210c, respectively. The mixer 210a mixes a signal received by means of the transmission/reception antenna 250a with a part of the RF signal fed in at the input 220a. As it is known, this generates signals at the output of the mixer 210a with frequencies that, on the one hand, correspond to the difference of the two mixer input signals and, on the other hand, to the sum of the frequencies of the two mixer input signals. In the unbalanced mixer 210a present in this embodiment, signals with the two frequencies to be mixed of the two mixer input signals are obtained additionally at the output of the mixer 210a. Normally, the interest will lie on a resulting low frequency signal so that it may be tapped by a corresponding low pass filtering at the output 270a of the integrated circuit 200. A signal received by an antenna not illustrated, which is connected to the terminal 280a, is mixed with a part of the RF signal received via the input 220a of the integrated circuit at the third unbalanced mixer 210c. In the same way as this has already been described for the output 270a, there is thus generated a low frequency reception signal at the output 290a that may be tapped at the output 290a for further processing.

Something corresponding of course also applies to the case of the right-hand, second part 200b of the integrated circuit 200. As the input 220 is a differential input of the integrated circuit 200, the signal fed in at the part terminal 220b is opposite in phase to the signal applied to the input 220a.

The embodiment illustrated according to FIG. 3 is a radar front end circuit having a total of four antennas. All four antennas operate as reception antennas, wherein the antennas connected to the terminals 250a, b also operate as transmission antennas at the same time. Since therefore there are two antenna elements available for the transmission path and four antenna elements available for the reception path, so-called beam forming is, for example, possible with special signal processing, in which a directional characteristic of an antenna array consisting of the antenna elements is variable and it is thus possible to have the vehicle radar arrangement "look" into certain directions both in the transmission and in the reception case. In the reception case, a finer resolution of the directional characteristic is achievable due to the higher number of antenna elements.

The circuit outlined in FIG. 3 is based on unbalanced, i.e. single-ended line routing on the semiconductor chip 200 whose substrate is a silicon or GaAs substrate and whose circuit components are produced by manufacturing processes allowing the production of radio frequency suitable transistors, particularly an Si/SiGe manufacturing process or an indium phosphide process. Only line portions from the differential LO terminal 220 to a portion 232 from which the lines 230a and 230b run away from each other may provide differential and/or symmetrical signal routing. Lines for differential signal routing may be understood to be lines that may run substantially parallel to each other in a distance of less than 1000 μm, preferably less than 100 μm and more preferably of less than 10 μm, and that may be arranged with respect to each other so that they have a predetermined wave impedance of, for example, 50 ohm. The transitions to the differential terminal 220 of the MMIC 200 are, for example, managed by bond wires. For example, patch antennas connected in an unbalanced way may be applied to the four unbalanced antenna terminals (250*a, b*; 280*a, b*), whereas a differential signal of a local oscillator (not illustrated) is supplied to the differential LO terminal 220. For vehicle radar systems, the oscillation frequency of this LO signal is, for example, 77 GHz. When the patch antennas receive signals, they are mixed with parts of the differential LO signal by the unbalanced mixers 210*a-d*, thus obtaining unbalanced signals at the unbalanced terminals 270*a, b* and 290*a, b*, respectively, which have a frequency corresponding to the difference of the frequencies of the differential LO signal and the unbalanced reception signals applied to the terminals 250*a, b* and 280*a, b*.

By the integration of individual unbalanced mixers on a chip illustrated in FIG. 3, the originally unbalanced transitions from an RF circuit board to the semiconductor chip 200 in the transmission branch become differential transitions. In this way, transition losses may be reduced, and due to the fact that the compensation current does no longer flow in the reference plane as in a single-ended transition, less spurious signals form on the on-chip reference plane. On the reception side, however, the transitions (250*a, b*; 280*a, b*) still operate in an unbalanced way. Due to the small reception power, however, this is uncritical. One particular aspect is the configuration of the power dividers 260*a, b*. Compared to FIG. 1, where the power is already divided at the local oscillator input of the double mixer configuration, the power dividers 260*a, b* are connected to local oscillator outputs of the directional couplers 240*a, b*. As a result, there is a transmission power at the antenna that is higher by the coupler loss.

Furthermore, in further embodiments, the outputs 270*a, b* and/or 290*a, b* of the integrated circuit coupled to the mixer outputs may be implemented in a differential way for low frequency signals, just as the corresponding mixer outputs.

In further embodiments, some or all of the components of the integrated circuit 200 illustrated in FIG. 3 (directional couplers, mixers, power dividers) may be implemented in a differential way. This would mean that a mode conversion between the unbalanced lines and the concerned balanced and/or differential components would have to be done on the chip, for example by baluns.

Figure 4:
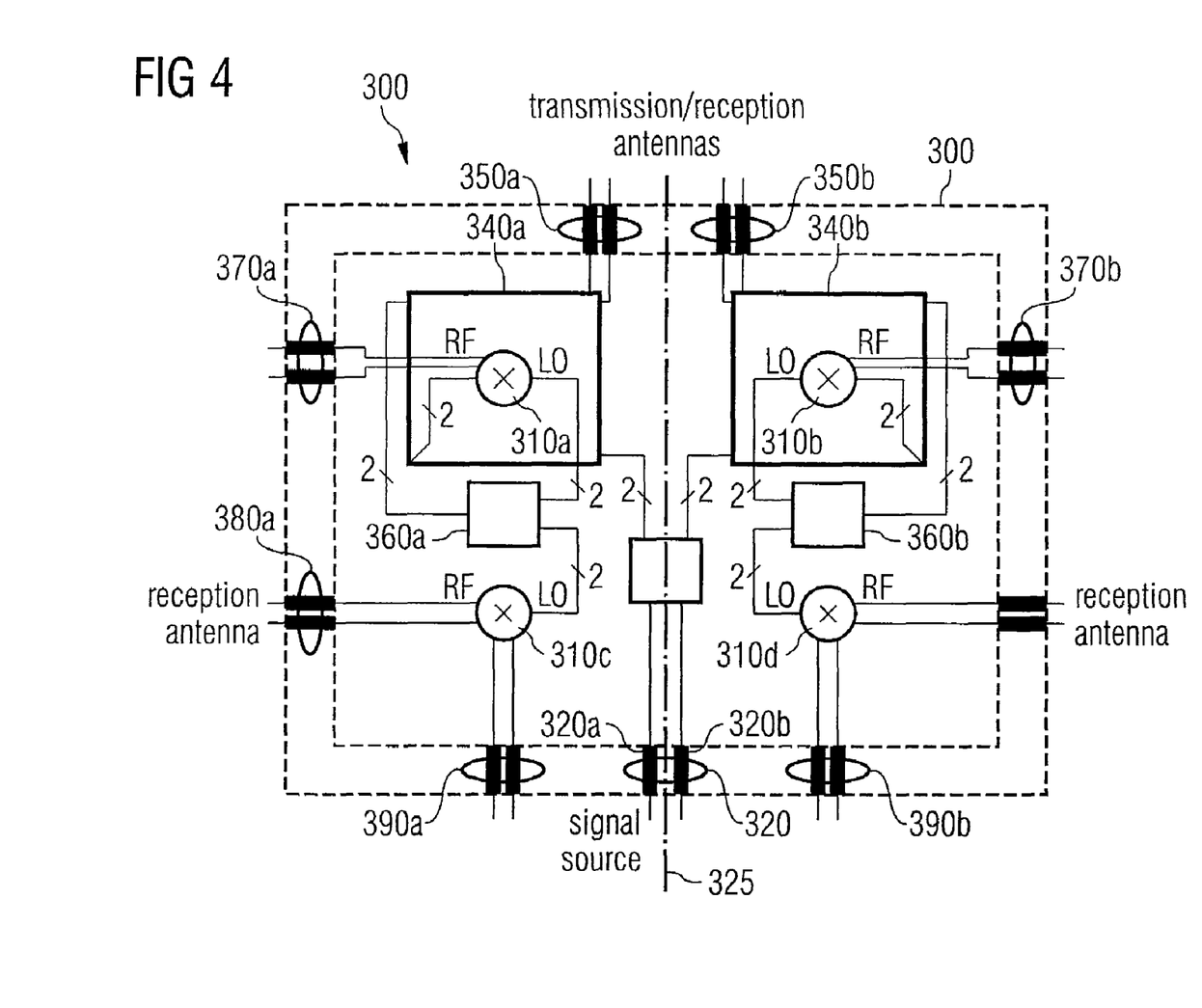
FIG. 4 is a block circuit diagram for illustrating the integration of four individual mixers on a chip in a continuously differential configuration.

A further embodiment is shown in FIG. 4. The basic operation of the integrated circuit is identical to the circuit illustrated in FIG. 3. However, a continuously differential architecture is used on the chip in FIG. 4, i.e. both all terminals and the signal routing are designed in a differential way.

The integrated circuit 300 comprises a first circuit portion 300*a* (left) and a second circuit portion 300*b* (right) of the integrated circuit. The two circuit portions 300*a, b* are arranged mirror-symmetrically to an axis 325 running in the center from top to bottom through the integrated circuit 300 illustrated in FIG. 4. Due to the symmetry and the resulting analogy of the circuit portions 300*a, b*, the following circuit descriptions will be limited to only the circuit portion 300*a*.

The integrated circuit 300 comprises a differential input 320 for receiving a differential RF input signal. The terminal 320 is connected to a differential power divider 330 via a differential line. A first differential output of the power divider 330 is coupled to a first differential terminal of a first directional coupler 340*a* of the first circuit portion 300*a* of the integrated circuit 300, and a second differential output of the power divider 330 is coupled to a first differential terminal of a second directional coupler 340*b* of the integrated circuit 300. The second directional coupler 340*b* is in the second circuit portion 300*b* of the integrated circuit 300. Furthermore, a first differential antenna terminal 250*a* is connected to a second differential terminal of the first directional coupler 340*a*. Via a third differential terminal of the directional coupler 340*a*, the same is coupled to a first differential power divider 360*a*. Furthermore, a first differential output of the power divider 360*a* is connected to a first input of a first differential mixer 310*a*, whose second input is connected to the first differential antenna terminal 350*a* via the directional coupler 340*a*. A differential output 370*a* of the integrated circuit 300 constitutes a differential output of the first mixer 310*a*. Furthermore, a second differential output of the power divider 360*a* is connected to a first input of a third differential mixer 310*c*. A further differential antenna terminal 380*a* of the integrated circuit 300 is connected to a second differential input of the third mixer 310*c*. A third differential terminal of the mixer 310*c* constitutes a differential output of the mixer 310*c* and is connected to a further differential terminal 390*a* of the integrated circuit 300.

The structure of the first circuit portion 300*a* of the integrated circuit just described correspondingly applies to the second circuit portion 300*b* arranged mirror-symmetrically to the first circuit portion 300*a*, the second circuit portion comprising the second directional coupler 340*b* coupled to the input terminal 320 via the power divider 330, and a second mixer 310*b* coupled to the second directional coupler 340*b*. Furthermore, the second circuit portion 300*b* includes a second differential antenna terminal 350*b* coupled to the second coupler 340*b*. Due to the mirror symmetry to the first circuit portion 300*a*, the description of the structure of the second circuit portion 300*b* of the integrated circuit 300 will be omitted at this point for reasons of clarity.

Via the differential input 320 of the integrated circuit 300, an RF signal of a local oscillator (LO) not illustrated is fed in, for example. For vehicle radar applications, the frequency of the input signal may, for example, be 77 GHz. Via the differential power divider 330, now a first part of the differential radio frequency input signal is supplied onto the first directional coupler 340*a*. It couples 50% of the power of the first part of the differential radio frequency input signal onto the antenna terminal 350*a*. At this differential antenna terminal, there may be connected, for example, a differential patch antenna acting both as transmission and as reception antenna of the vehicle radar system. The second 50% of the power of the first part of the fed in RF input signal are coupled onto the input of the power divider 360*a* via a third terminal of the directional coupler 340*a*. As a result, 25% of the differential RF input signal fed in at the differential input 320 are applied to the two outputs of the power divider 360*a*, respectively, which are supplied to the two balanced mixers 310*a* and 310*c*, respectively. The differential mixer 310*a* mixes a signal received by means of the differential transmission/reception antenna 350*a* with the RF signal fed in at the differential input 320. As it is known, this generates signals at the output of the differential mixer 310*a* having frequencies corresponding, on the one hand, to the difference of the two mixer input signals and, on the other hand, to the sum of the frequencies of the two mixer input signals. Normally, the interest will lie on a resulting low frequency signal so that it may be tapped at the differential output 370*a* of the integrated circuit 300 by a corresponding low pass filtering. A signal received by a differential antenna not illustrated, which is connected at the differential terminal 380*a*, is mixed with a part of the RF signal received via the differential input 320 of the integrated circuit at the third balanced mixer 310*c*. In the same way as it has already been described for the output 370*a*, there is thus generated a low frequency reception signal at the differential output 390*a*, which may be tapped at the differential output 390 for further processing.

Of course, something corresponding equally applies to the case of the right-hand, second part 300b of the integrated circuit 300. A distance between the first terminal pole and the second terminal pole of the differential terminals of the integrated circuit 300 is preferably less than 1000 μm, preferably less than 100 μm and more preferably less than 50 μm.

As in the embodiment illustrated in FIG. 3, the embodiment illustrated in FIG. 4 is, for example, a part of a radar front end circuit with a total of four differential antennas, wherein all four antennas operate as reception antennas and the antennas connected to the terminals 350a, b also function as transmission antennas at the same time.

The circuit outlined in FIG. 4 is based on continuously balanced, i.e. differential line routing on the MMIC 300, whose substrate is a silicon or GaAs substrate and whose circuit components are produced by radio frequency suitable processes, particularly an Si/SiGe process or an indium phosphide process. The transitions to the differential terminal 320 of the MMIC 300 are, for example, managed by bond wires. For example, differentially connected patch antennas may be applied to the four differential antenna terminals (350a, b; 380a, b). A differential signal of a local oscillator (not illustrated) is supplied to the differential LO terminal 320. For vehicle radar systems, the oscillation frequency of this LO signal is, for example, 77 GHz. When the differential patch antennas receive signals, they are mixed with parts of the differential LO signal by the differential mixers 310a-d, thus obtaining differential signals at the differential terminals 370a, b and 390a, b, respectively, having a frequency corresponding to the difference of the frequencies of the differential LO signal and the differential reception signals applied to the terminals 350a, b and 380a, b.

The embodiment shown in FIG. 4 now also results in differential transitions for the reception branch, and baluns on the chip 300 may generally be omitted. As a result, the mixers 310a-d may have a further reduced noise factor. In addition, fewer signals may be mapped on the on-chip reference plane due to the consistently differential signal routing, and the isolation between the individual mixers may be increased.

In the embodiment shown in FIG. 4, unbalanced transitions may be omitted which may result in manufacturing and performance advantages, particularly for the circuit parts carrying radio frequency signals. A continuously differential design allows minimal transition losses and a high isolation between different circuit blocks on a common chip. In addition, an antenna base power higher by about 4 dB than in conventional approaches may be achieved by the arrangement of the power dividers 360a, b. This equally means a reception power higher by 4 dB and an associated larger range of a radar system in which the circuit illustrated in FIG. 4 is used in a front end circuit. Due to the considerably higher manufacturing precision of the on-chip structures as compared to structures on RF substrate, the designs become more homogeneous and stable. A further advantage is the special arrangement of the mixers within the couplers. This particularly allows a space-saving implementation of the integrated circuits shown in FIG. 3 and FIG. 4.

While this invention has been described in terms of several embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

What is claimed is:

1. An integrated circuit comprising: an input terminal;
a first circuit portion comprising a first coupler coupled to the input terminal, and a first mixer coupled to the first coupler;
a first antenna terminal coupled to the first coupler;
a second circuit portion comprising a second coupler coupled to the input terminal, and a second mixer coupled to the second coupler;
a second antenna terminal coupled to the second coupler;
wherein the input terminal is a differential input terminal; and
wherein the first coupler is coupled to a first terminal pole of the differential input terminal via a first line, and the second coupler is coupled to a second terminal pole of the differential input terminal via a second line; or
wherein the first coupler and the second coupler are coupled to the differential input terminal via differential lines and a differential power divider.

2. The integrated circuit of claim 1, wherein the second circuit portion is arranged mirror-symmetrically to the first circuit portion.

3. The integrated circuit of claim 1, wherein the first and/or the second coupler comprises a directional coupler.

4. The integrated circuit of claim 1, wherein the first circuit portion comprises a first power divider and a third mixer, wherein the first coupler is coupled to the first mixer and the third mixer via the first power divider.

5. The integrated circuit of claim 4, comprising a third antenna terminal coupled to the third mixer.

6. The integrated circuit of claim 4, wherein the first coupler comprises a first directional coupler, wherein a first terminal of the first directional coupler is coupled to the input terminal, wherein a second terminal of the first directional coupler is coupled to the first antenna terminal, wherein a third terminal of the first directional coupler is coupled to the first power divider, and wherein a fourth terminal of the first directional coupler is coupled to the first mixer.

7. The integrated circuit of claim 4, wherein the second circuit portion comprises a second power divider and a fourth mixer, wherein the second coupler is coupled to the second mixer and the fourth mixer via the second power divider.

8. The integrated circuit of claim 7, comprising a fourth antenna terminal coupled to the fourth mixer.

9. The integrated circuit of claim 7, wherein the second coupler comprises a second directional coupler, wherein a first terminal of the second directional coupler is coupled to the input terminal, wherein a second terminal of the second directional coupler is coupled to the second antenna terminal, wherein a third terminal of the second directional coupler is coupled to the second power divider, and wherein a fourth terminal of the second directional coupler is coupled to the second mixer.

10. The integrated circuit of claim 1, wherein the first antenna terminal is coupled to the first mixer via the first coupler.

11. The integrated circuit of claim 1, wherein the second antenna terminal is coupled to the second mixer via the second coupler.

12. The integrated circuit of claim 1, comprising unbalanced lines between the first coupler and the first antenna terminal, between the first coupler and the first mixer, between the second coupler and the second antenna terminal and/or between the second coupler and the second mixer.

13. The integrated circuit of claim 1, comprising differential lines between the first coupler and the first antenna terminal, between the first coupler and the first mixer, between the second coupler and the second antenna terminal and/or between the second coupler and the second mixer.

14. The integrated circuit of claim 1, wherein the first and the second antenna terminal are differential antenna terminals.

15. The integrated circuit of claim 14, wherein a distance between a first terminal pole and a second terminal pole of the first and/or the second antenna terminal is less than 1000μm.

16. The integrated circuit of claim 2, wherein a distance between a first terminal pole and a second terminal pole of the differential input terminal is less than 1000μm.

17. The integrated circuit of claim 1, formed on a substrate of a circuit chip.

18. The integrated circuit of claim 17, wherein the substrate is a silicon substrate or a GaAs substrate.

19. The integrated circuit of claim 1, wherein the integrated circuit comprises components produced by radio frequency suitable processes.

20. An integrated circuit comprising:
a unit for receiving an input signal;
a unit for coupling a first part of the input signal to a first circuit portion of the integrated circuit and for coupling a second part of the input signal to a second circuit portion of the integrated circuit;
wherein the first circuit portion comprises a unit for coupling a part of the first part of the input signal to a first antenna terminal and a unit for mixing another part of the input signal with a first reception signal; and
wherein the second circuit portion of the integrated circuit comprises a unit for coupling a part of the second part of the input signal to a second antenna terminal and a unit for mixing another part of the second part of the input signal with a second reception signal.

21. The integrated circuit of claim 20, wherein the second circuit portion is arranged substantially mirror-symmetrical to the first circuit portion.

22. The integrated circuit of claim 20, wherein the input signal is a radio frequency signal.

23. The integrated circuit of claim 20, wherein the input signal is a differential input signal.

24. The integrated circuit of claim 20, wherein the first antenna terminal and/or the second antenna terminal is a differential antenna terminal.

25. A radar circuit with an integrated circuit of claim 1.

26. A radar circuit with an integrated circuit of claim 20.

27. A method for transmitting and receiving radio frequency signals, comprising:
receiving a differential radio frequency input signal;
dividing the differential input signal into a first part and a second part;
coupling a part of the first part of the differential input signal to a first antenna terminal and mixing another part of the first part of the differential input signal with a first reception signal; and
coupling a part of the second part of the differential input signal to a second antenna terminal and mixing another part of the second part of the differential input signal with a second reception signal.

28. The method of claim 27, wherein coupling the one part of the first part of the differential input signal to the first antenna terminal and coupling the other part of the first part of the differential input signal to an input of a first mixer is done using a first directional coupler.

29. The method of claim 28, wherein coupling the one part of the second part of the differential input signal to the second antenna terminal and coupling the other part of the second part of the differential input signal to an input of a second mixer is done using a second directional coupler.

30. The method of claim 27, wherein the other part of the first part of the differential input signal is coupled to a first power divider.

31. The method of claim 30, wherein the other part of the second part of the differential input signal is coupled to a second power divider.

32. The method of claim 30, wherein a first output signal of the first power divider is mixed with the first reception signal, and wherein a second output signal of the first power divider is mixed with a third reception signal.

33. The method of claim 32, wherein a first output signal of the second power divider is mixed with the second reception signal, and wherein a second output signal of the second power divider is mixed with a fourth reception signal.

34. The method of claim 32, further comprising receiving the first reception signal by means of a first antenna and receiving the third reception signal by means of a third antenna.

35. The method of claim 33, further comprising receiving the second reception signal by means of a second antenna and receiving the fourth reception signal by means of a fourth antenna.

36. The method of claim 27, wherein dividing the differential input signal is done by means of a first line only coupling a first terminal pole of a differential input terminal to a first coupler, and further by means of a second line only coupling a second terminal pole of the differential input terminal to a second coupler.

37. The method of claim 27, wherein dividing the differential input signal is done by means of a differential power divider with a differential input and a first and a second differential output.

38. The method of claim 37, wherein radio frequehoy signals are routed differentially.

39. The method of claim 27, wherein the differential input signal has a frequency of more than 1GHz.

40. An integrated circuit comprising:
an input terminal;
a first circuit portion comprising a first coupler coupled to the input terminal, and a first mixer coupled to the first coupler;
a first antenna terminal coupled to the first coupler;
a second circuit portion comprising a second coupler coupled to the input terminal, and a second mixer coupled to the second coupler;
a second antenna terminal coupled to the second coupler;
wherein the first circuit portion comprises a first power divider and a third mixer, wherein the first coupler is coupled to the first mixer and the third mixer via the first power divider; and
wherein a third antenna terminal is coupled to the third mixer; or
wherein the first coupler comprises a first directional coupler, wherein a first terminal of the first directional coupler is coupled to the input terminal, wherein a second terminal of the first directional coupler is coupled to the first antenna terminal, wherein a third terminal of the first directional coupler is coupled to the first power divider, and wherein a fourth terminal of the first directional coupler is coupled to the first mixer.

41. An integrated circuit comprising:
an input terminal;
a first circuit portion comprising a first coupler coupled to the input terminal, and a first mixer coupled to the first coupler;

a first antenna terminal coupled to the first coupler;
a second circuit portion comprising a second coupler coupled to the input terminal, and a second mixer coupled to the second coupler;
a second antenna terminal coupled to the second coupler,
wherein the first circuit portion comprises a first power divider and a third mixer, wherein the first coupler is coupled to the first mixer and the third mixer via the first power divider
wherein the second circuit portion comprises a second power divider and a fourth mixer, wherein the second coupler is coupled to the second mixer and the fourth mixer via the second power divider; and
wherein a fourth antenna terminal is coupled to the fourth mixer; or
wherein the second coupler comprises a second directional coupler, wherein a first terminal of the second directional coupler is coupled to the input terminal, wherein a second terminal of the second directional coupler is coupled to the second antenna terminal, wherein a third terminal of the second directional coupler is coupled to the second power divider, and wherein a fourth terminal of the second directional coupler is coupled to the second mixer.

* * * * *